(12) United States Patent
Doniger

(10) Patent No.: US 6,802,047 B1
(45) Date of Patent: Oct. 5, 2004

(54) CALCULATING RESISTANCE OF CONDUCTOR LAYER FOR INTEGRATED CIRCUIT DESIGN

(75) Inventor: Kenneth Doniger, Menlo Park, CA (US)

(73) Assignee: LSI Logic Corporation, Milpitas, CA (US)

(*) Notice: Subject to any disclaimer, the term of this patent is extended or adjusted under 35 U.S.C. 154(b) by 87 days.

(21) Appl. No.: 10/224,019

(22) Filed: Aug. 19, 2002

(51) Int. Cl.[7] .................. G06F 17/50; G06F 9/45; G01R 31/26
(52) U.S. Cl. .................. 716/5; 716/4; 716/8; 324/765
(58) Field of Search .................. 716/5, 4, 8; 324/765

(56) References Cited

U.S. PATENT DOCUMENTS 6,028,440 A * 2/2000 Roethig et al. ............. 324/765

OTHER PUBLICATIONS

S. Tani et al., Parasitic Capacitance Modeling for Multilevel Interconnects, Asia–Pacific Conference on Circuits and Systems, pp. 59–64, Oct. 2002.*

Collin, Robert "Field Theory of Guided Waves". 2nd Edition, IEEE' Press 1990, pp. 279–282.

* cited by examiner

Primary Examiner—A. M. Thompson
(74) Attorney, Agent, or Firm—Thelen Reid & Priest, LLP

(57) ABSTRACT

A variational method is used for calculating resistance of a conductor layer for an integrated circuit design, the conductor layer having a geometric shape defined by boundary edges. The method includes (a) partitioning the geometric shape into a plurality of rectangular regions, (b) determining at least one source edge and at least one sink edge from among the boundary edges, a current entering the conductor layer through the source edge(s) and leaving the conductor layer through the sink edge(s), (c) setting boundary conditions with respect to the current for each of the rectangular regions, (d) calculating power for each of the rectangular regions with the boundary conditions, (e) calculating power for the conductor layer based on the power and the boundary conditions of each of the rectangular regions, and (f) obtaining the resistance of the conductor layer by minimizing the power dissipation of the conductor layer.

42 Claims, 6 Drawing Sheets

CALCULATING RESISTANCE OF CONDUCTOR LAYER FOR INTEGRATED CIRCUIT DESIGN

FIELD OF THE INVENTION

The present invention relates to circuit extraction in integral circuit (IC) design processes. More particularly, the present invention relates to a method and apparatus for calculating resistance of a conductor layer for an IC design.

BACKGROUND OF THE INVENTION

As complexity and performance of IC and Very Large Scale Integration (VLSI) circuit increases, time delay due to interconnects is becoming as significant as that of logic gates. Interconnect resistance (or wire resistance) is one of the important parameters for such a time delay calculation and other circuit characterization.

Interconnects are typically formed with a thin-film, i.e., a two-dimensional metal or conductor layer. Thus, interconnect resistance is typically calculated using the sheet resistance Rs, which is measured in Ohms per square ($\Omega/\square$). The sheet resistance Rs takes the material properties and thickness into account, and the resistance of a square unit of material is the same for a square of any size. Thus, the resistance of a conductor layer is calculated as the product of the sheet resistance Rs and the number of squares S. However, there are no formulas for the number of squares S except for conductor layers having the simplest geometry such as a rectangle.

FIG. 1A illustrates a simple rectangular conductor having a length L and a width w. The current flows through the length L from one end to the other, perpendicular to the width w. In this case, the number of squares S is given as S=L/w. However, conductor shapes can be more complicated, for example, as shown in FIG. 1B. Suppose that the current enter the conductor from one edge 11 to another edge 13, current paths need not be straight. This makes it difficult to define a length and a width of the conductor shape, and renders the resistance calculation inaccurate.

Various electronic design automation (EDA) software tools are used for calculating resistance of interconnects or conductor layers. Some software tools (such as those referred to as field solvers) calculate resistance of interconnects by dividing an design area including the interconnects into a small mesh, and calculating potential at each grid points. However, such a potential field calculation takes a substantial amount of time.

BRIEF DESCRIPTION OF THE INVENTION

A variational method is used for calculating resistance of a conductor layer for an integrated circuit design, the conductor layer having a geometric shape defined by boundary edges. The method includes (a) partitioning the geometric shape into a plurality of rectangular regions, (b) determining at least one source edge and at least one sink edge from among the boundary edges, a current entering the conductor layer through the source edge(s) and leaving the conductor layer through the sink edge(s), (c) setting boundary conditions with respect to the current for each of the rectangular regions, (d) calculating power for each of the rectangular regions with the boundary conditions, (e) calculating power for the conductor layer based on the power and the boundary conditions of each of the rectangular regions, and (f) obtaining the resistance of the conductor layer by minimizing the power dissipation of the conductor layer.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings:

FIGS. 1A and 1B are diagrams schematically illustrating examples of a conductor layer.

DETAILED DESCRIPTION

Figure 1B:
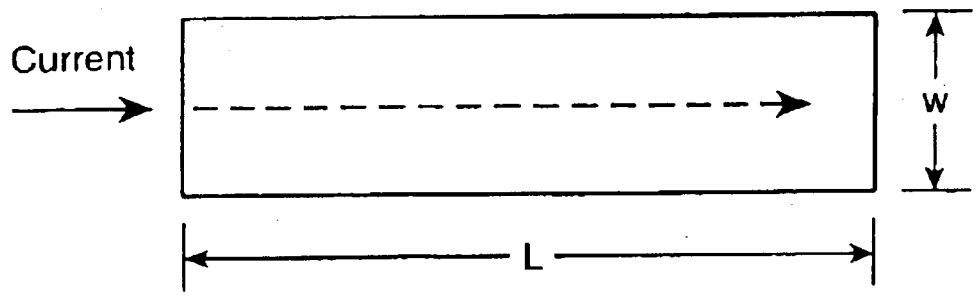
Figure 1B:
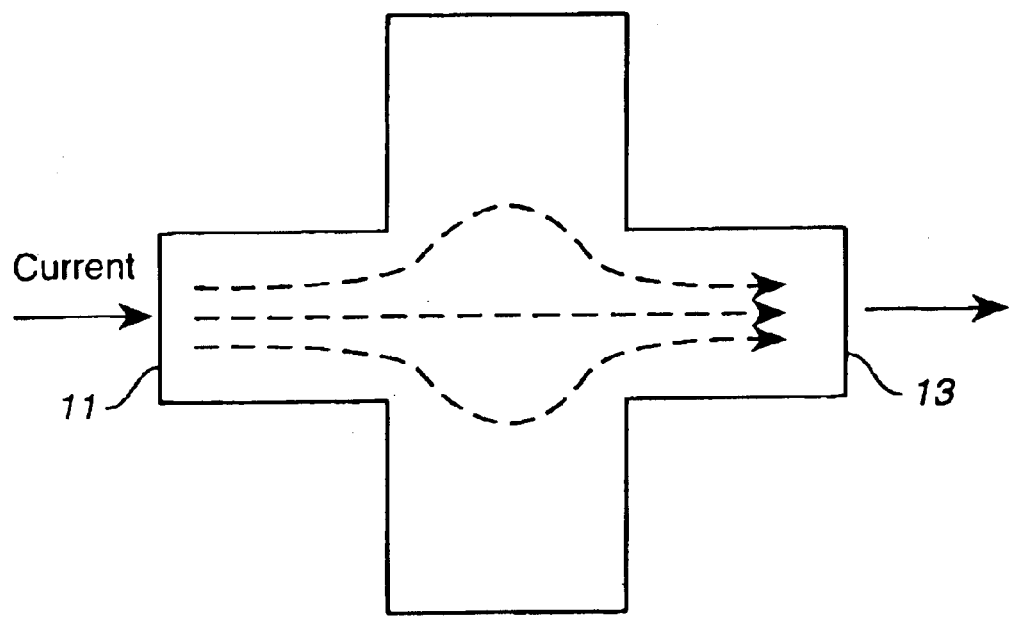

Embodiments of the present invention are described herein in the context of calculating resistance of a conductor layer of for an IC design. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with the present invention, the components, process steps, and/or data structures may be implemented using various types of operating systems (OS), computing platforms, firmware, computer programs, computer languages, and/or general-purpose machines. The method can be run as a programmed process running on processing circuitry. The processing circuitry can take the form of numerous combinations of processors and operating systems, or on a stand-alone device. The process can be implemented as instructions executed by such hardware, hardware alone, or any combination thereof. The software may be stored on a program storage device readable by a machine.

In accordance with one embodiment of the present invention, the method may be implemented on a data processing computer such as a personal computer, workstation computer, mainframe computer, or high performance server running an OS such as Solaris® available from Sun Microsystems, Inc. of Palo Alto, Calif., Microsoft® Windows® XP and Windows® 2000, available form Microsoft Corporation of Redmond, Wash., or various versions of the Unix operating system such as Linux available from a number of vendors. The method may also be implemented on a multiple processor system, or in a computing environment including various peripherals such as input devices, output devices, displays, pointing devices, memories, storage devices, media interfaces for transferring data to and from the processor(s), and the like, all as well known to those of ordinary skill in the art. In addition, such a computer system or computing environment may be networked locally, or over the Internet.

Figure 2:
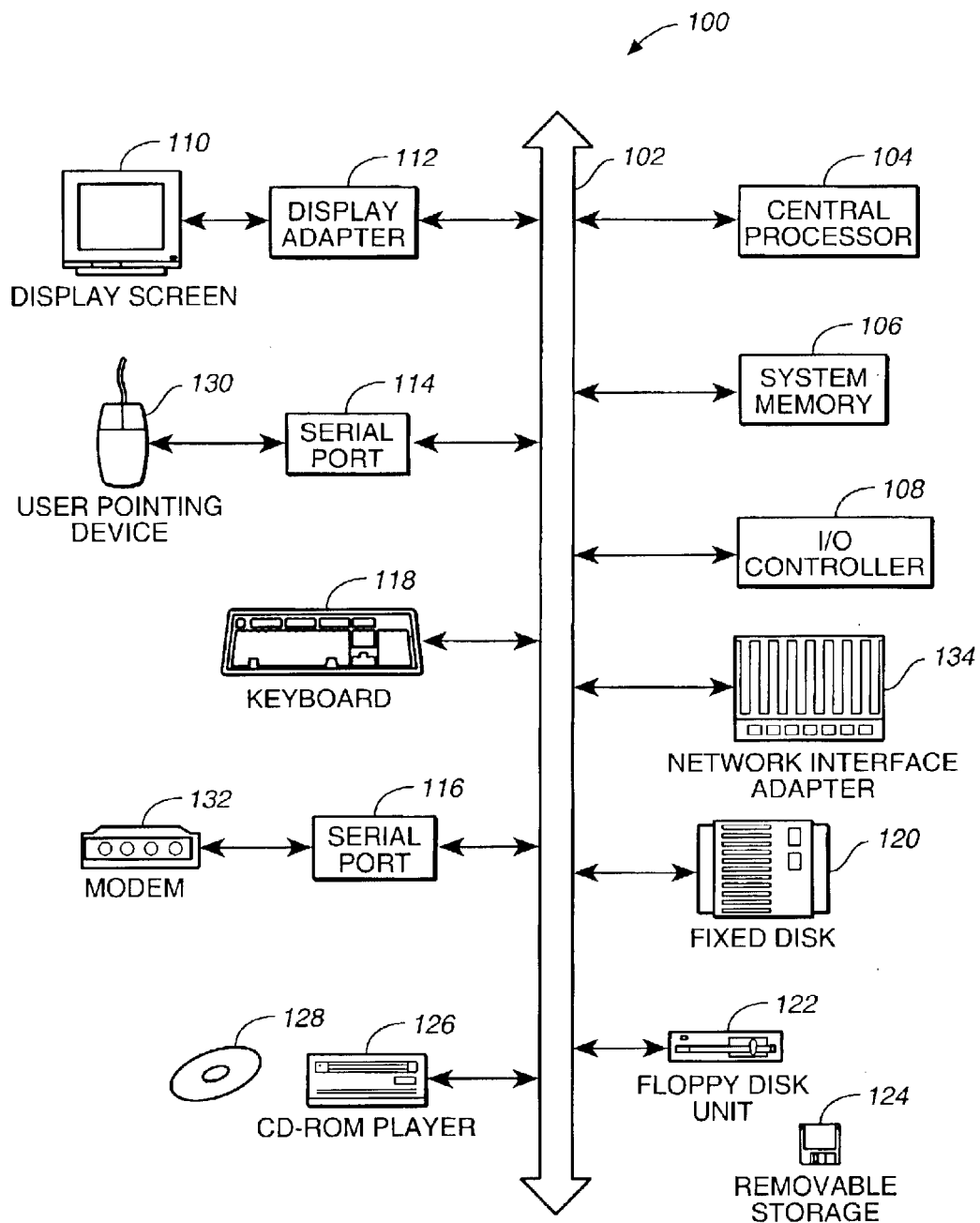
FIG. 2 is a block diagram schematically illustrating a computer system suitable for implementing aspects of the present invention.

FIG. 2 depicts a block diagram of a computer system 100 suitable for implementing aspects of the present invention. As shown in FIG. 2, computer system 100 includes a bus 102 which interconnects major subsystems such as a central processor 104, a system memory 106 (typically RAM), an input/output (I/O) controller 108, an external device such as a display screen 110 via display adapter 112, serial ports 114 and 116, a keyboard 118, a fixed disk drive 120, a floppy disk drive 122 operative to receive a floppy disk 124, and a CD-ROM player 126 operative to receive a CD-ROM 128. Many other devices can be connected, such as a pointing device 130 (e.g., a mouse) connected via serial port 114 and a modem 132 connected via serial port 116. Modem 132 may provide a direct connection to a remote server via a telephone link or to the Internet via a POP (point of presence). Alternatively, a network interface adapter 134 may be used to interface to a local or wide area network using any network interface system known to those skilled in the art (e.g., Ethernet, xDSL, AppleTalk™).

Many other devices or subsystems (not shown) may be connected in a similar manner. Also, it is not necessary for all of the devices shown in FIG. 2 to be present to practice the present invention, as discussed below. Furthermore, the devices and subsystems may be interconnected in different ways from that shown in FIG. 2. The operation of a computer system such as that shown in FIG. 2 is readily known in the art and is not discussed in detail in this application, so as not to overcomplicate the present discussion. Code to implement the present invention may be operably disposed in system memory 106 or stored on storage media such as fixed disk 120, floppy disk 124 or CD-ROM 128.

In accordance with one embodiment of the present invention, the calculation of resistance of a conductor layer involves a variational method. The variational method is based on the fact that "currents follow the path of least resistance." In more scientific language, the electric current flows such that the power dissipation is a minimum in a system that obeys Laplace's equation. A conductor is a system that obeys Laplace's equation, as can be seen below.

According to Ohm's law:

$$J = \sigma E \quad (1)$$

where $\sigma$ denotes conductivity of the medium (conductor), J denotes current density, and E denotes the electric field. In the static case, the electric field E is represented as:

$$E = -\nabla \Phi \quad (2)$$

where $\Phi$ is the electrostatic potential.

A resistive system cannot store or hold electric current. Therefore, the amount of current entering the system at the time must be balanced by the amount of current leaving the system. This condition is expressed as:

$$\nabla \cdot J = 0. \quad (3)$$

Substitution of equation (2) into equation (1), and equation (1) into equation (3) yields Laplace's equation:

$$\nabla^2 \Phi = 0. \quad (4)$$

Using $P = J \cdot E$ and equations (1) through (4), we find an expression for the dissipated power P as:

$$P = \sigma \int_A |\nabla \Phi|^2 \, dS \quad (5)$$

where A is the system area.

The power can also be written as $P = I^2 R$, where I denotes the total current in the system, and R denotes the total resistance. Thus, the total resistance is expressed as:

$$R = \frac{\sigma \int_A |\nabla \Phi|^2 \, dS}{I^2} \quad (6)$$

Thus, the resistance of the system is obtained from the power divided by the square of the total current.

Figure 3:
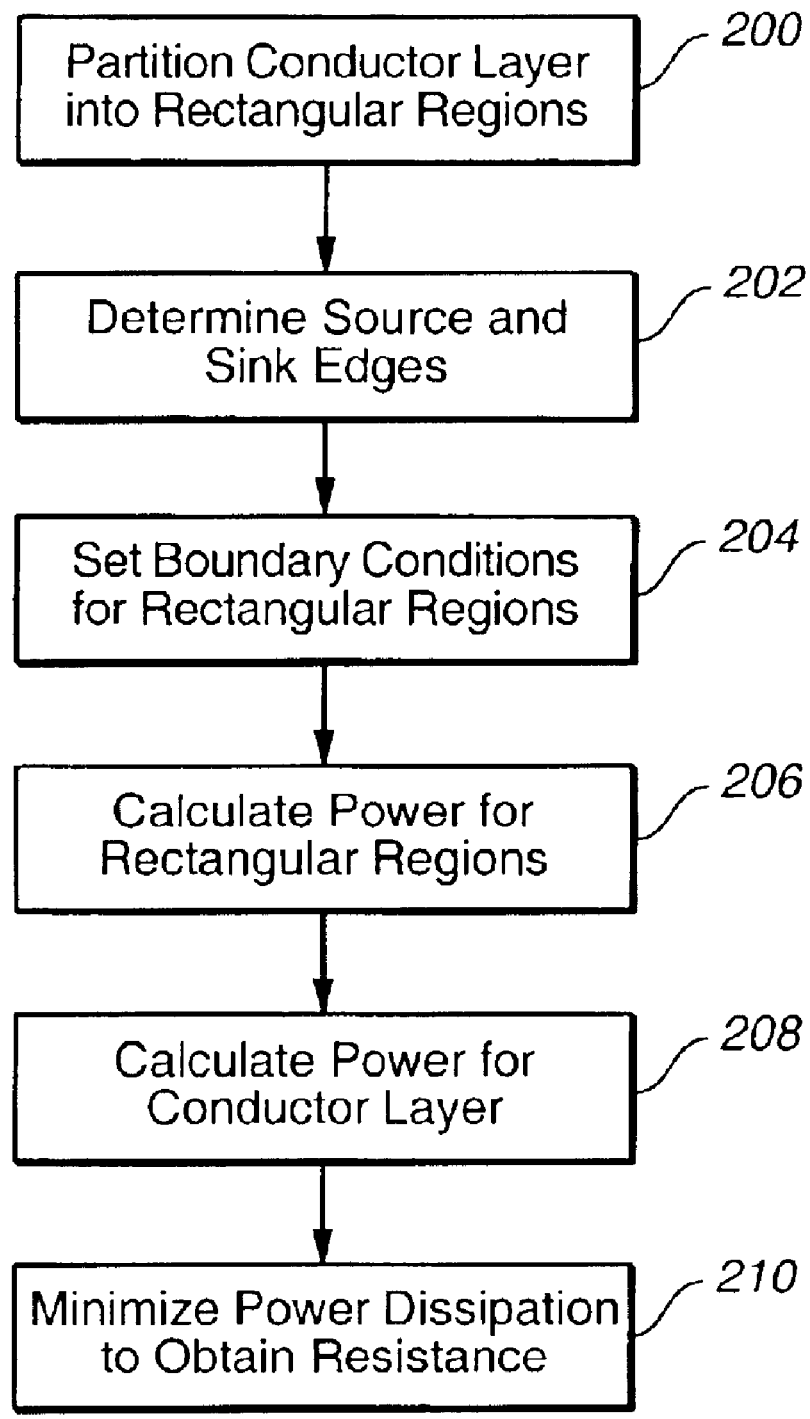
FIG. 3 is a process flow diagram schematically illustrating a method for calculating resistance of a conductor layer for an integrated circuit design in accordance with one embodiment of the present invention.
Figure 4A:
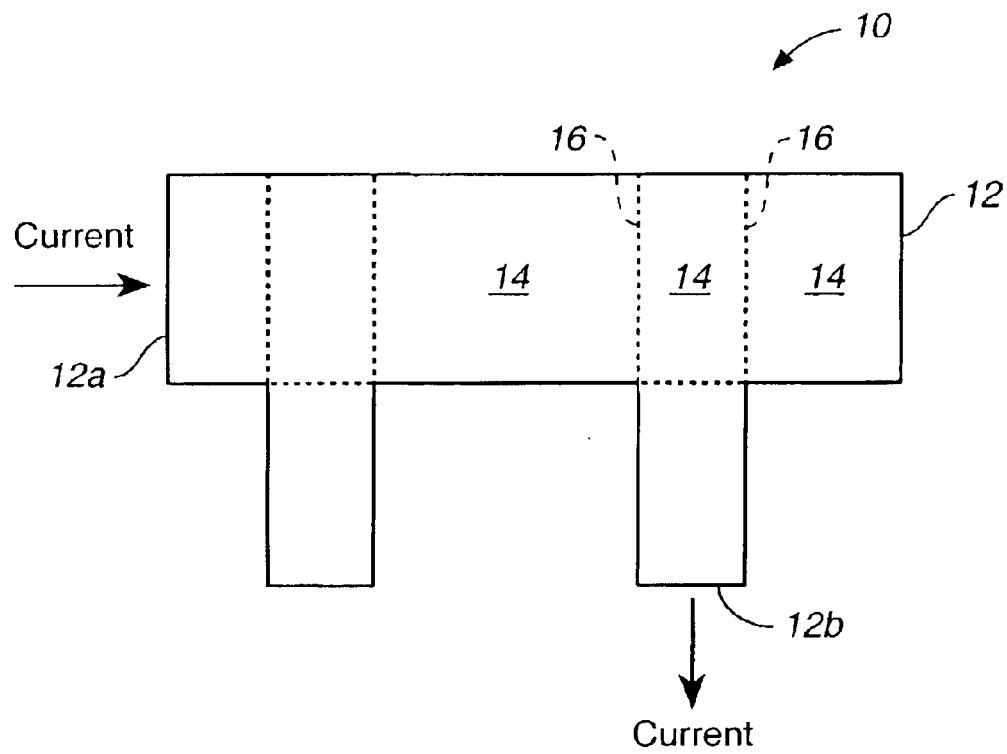
FIGS. 4A and 4B are diagrams schematically illustrating examples of a conductor layer partitioned into rectangular regions in accordance with one embodiment of the present invention.

Since solutions to Laplace's equation for simple shapes, such as rectangles, are known, the system is partitioned into rectangles in accordance with one embodiment of the present invention. FIG. 3 schematically illustrates a method for calculating resistance of a conductor layer for an integrated circuit design in accordance with one embodiment of the present invention. As shown in FIG. 3, a conductor layer is partitioned into a plurality of rectangular regions (200). FIG. 4A schematically illustrates an example of a conductor layer 10, which has a geometric shape referred to as a Kelvin structure. The geometric shape is defined by boundary edges (or outer boundaries: solid lines) 12, and partitioned into rectangular regions 14. As shown in FIG. 4A, the rectangular regions 14 are defined by the internal boundaries (dashed lines) 16 and/or the outer boundaries 12. In order to completely specify the electrostatic potential $\Phi$ in each rectangle, boundary conditions are established for each rectangle region 14.

Figure 4B:
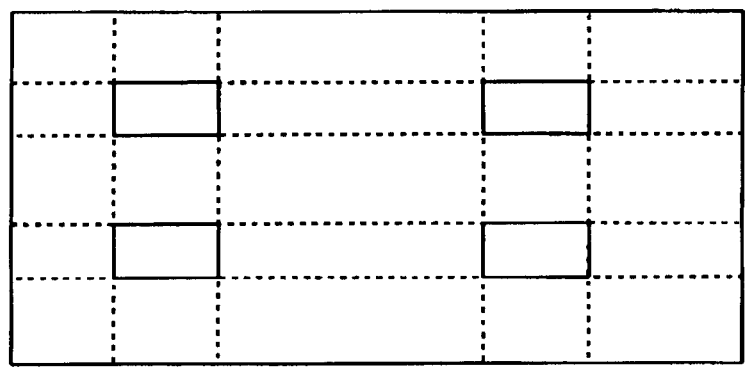

Regarding the outer boundaries 12, a source edge 12a through which a current enters the conductor layer 10, and a sink edge 12b through which the current leave the conductor layer 10 are determined (202). This also defines the current flow through the conductor layer 10. It should be noted that there may be more than one source edges and/or more than one sink edges in the system, and thus the present invention is also applicable to a multi-port system. In addition, a conductor layer may have more complicated shape, for example, as shown in FIG. 4B.

Then, boundary conditions are set with respect to the current for each of the rectangular regions (204). That is, the boundary conditions on each of the outer boundaries 12 and the inner boundaries 16 are determined. For example, on the boundary edges 12 where there are no currents entering or leaving the system (i.e., other than the source and sink edges), we have Neumann boundary conditions:

$$\hat{n}\cdot\nabla\Phi=0. \quad (7)$$

This condition means that the current cannot cross these boundaries.

Figure 5:
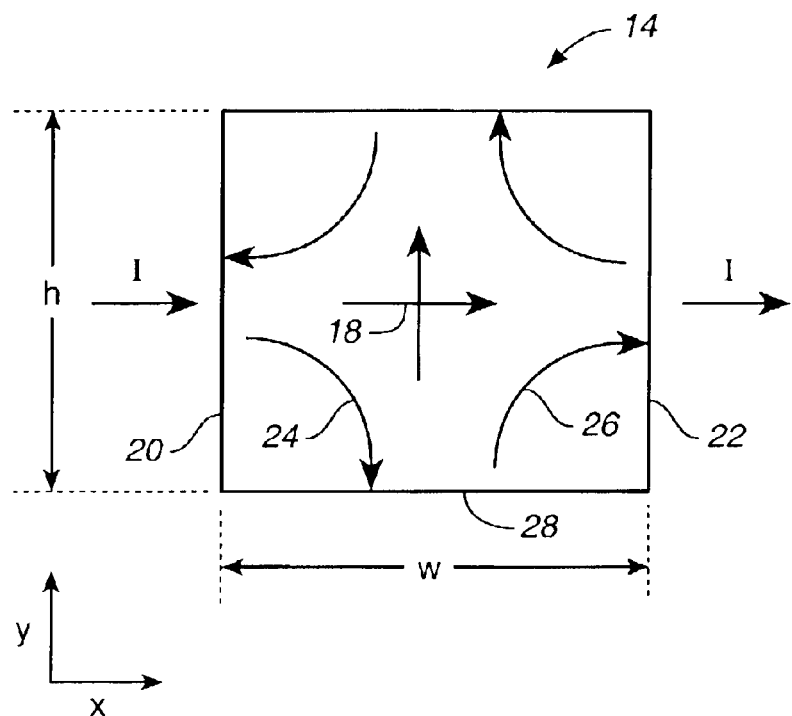
FIG. 5 is a diagram schematically illustrating the six possible net currents in a rectangular region.

It should be noted that currents of the system are used in the resistance calculation, compared with the conventional capacitance calculation that uses voltages of the system. The use of currents allows setting the boundary conditions of no net current through any boundary. Yet, there must be a net current flow through the system. Thus, terms that satisfy Laplace's equation are added to the electrostatic potential $\Phi$ in order to produce these currents. FIG. 5 schematically illustrates the six possible net currents that can flow in a rectangular region 14. For example, adding a term handling a straight current 18 is expressed as:

$$\Phi = -\frac{I}{h\sigma}x. \quad (8)$$

This term will produce a net current I entering through the left boundary 20 and exiting through the right boundary 22 (in the x-direction), where h is the height (in the y-direction) of the rectangular region 14. The type of terms to add to make the current "turn a corner" does not have an obvious form. The terms that produce the turning-a-corner currents have been found and added to the solution for the electrostatic potential $\Phi$. For example, the potential due to the current 26 that goes from the bottom boundary 28 to the right boundary 22 is expressed as:

$$\Phi = -\frac{I}{2\sigma hw}(x^2 - (h-y)^2) \quad (9)$$

where w is the width of the rectangular region 14 in the x-direction.

For the internal boundaries 16, the current between the adjacent rectangular regions 14 should be continuous. That is, a current flowing into any rectangular region 14 must be balanced by a current flowing out. A set of rectangular regions that form a cul-de-sac might have a current flow (and thus dissipate power) therein. However, the net current flow in or out of the rectangular regions must be zero. In order to take these constraints on the current into account, a variational technique using Lagrangian multipliers is employed. With these constraints, the internal boundaries 16 are "knitted" together using the solutions for the electrostatic potential $\Phi$ in the from of Fourier series on these boundaries.

Referring back to FIG. 3, the power for each of the rectangular regions (equation (5)) is calculated with the boundary conditions (206) as described above, and then the entire power for the conductor layer is calculated based on the power and the boundary conditions of each of the rectangular regions (208). The resistance of the conductor layer is obtained by minimizing the power dissipation of the conductor layer (210).

Figure 6:
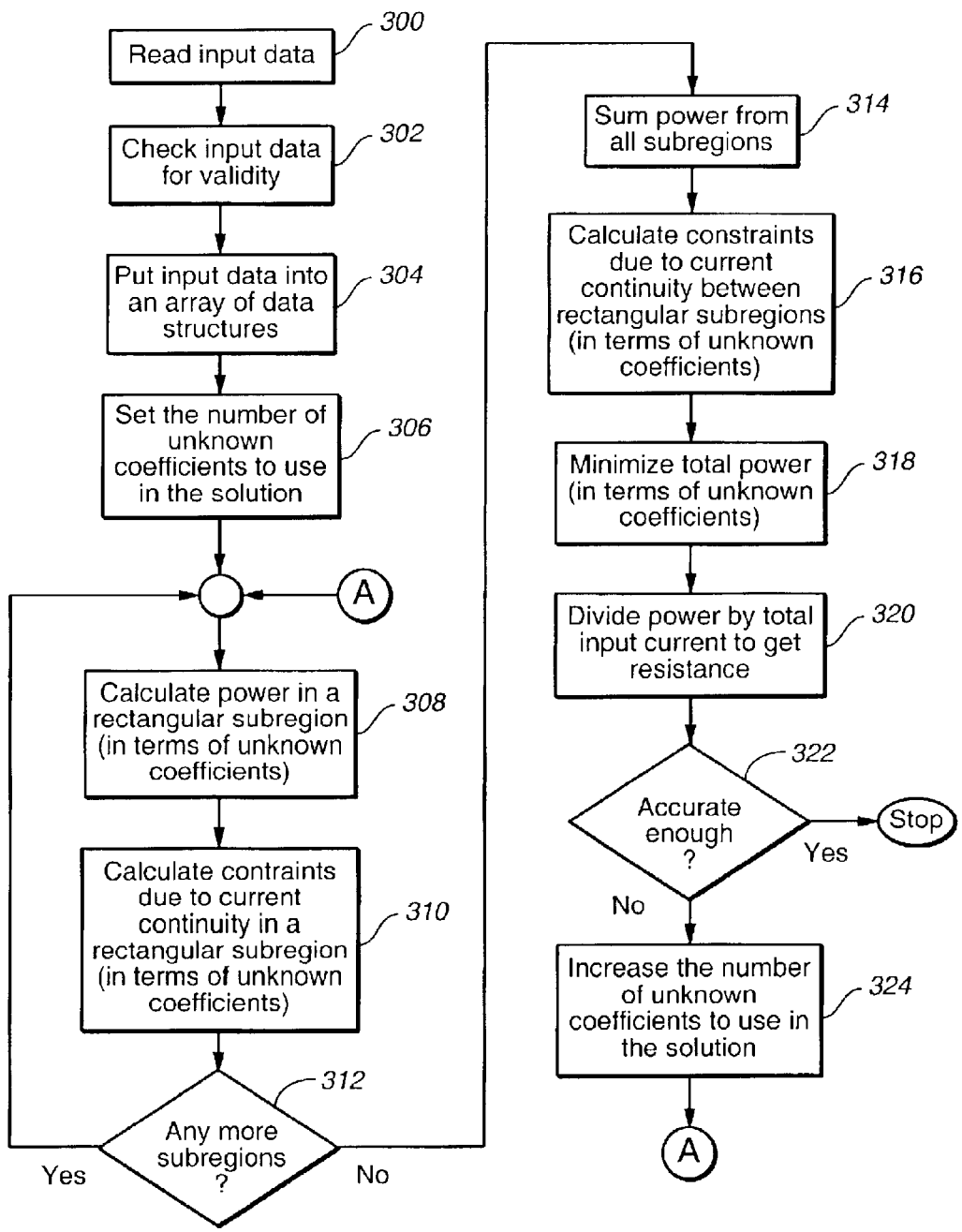
FIG. 6 is a process flow diagram schematically illustrating a method for calculating resistance of a conductor layer for an integrated circuit design in accordance with out embodiment of the present invention.

FIG. 6 schematically illustrates a method for calculating resistance of a conductor layer for an integrated circuit design in accordance with one embodiment of the present invention. The conductor layer has a geometric shape defined by boundary edges, and the geometric shape is partitioned into a plurality of rectangular regions (sub-regions) as described above. The information of the source edge(s) and the sink edge(s) of the conductor layer, the boundary conditions with respect to the current for each of the rectangular regions, and other parameters such as the conductivity of the conductor-layer material, the amount of current, and the like, are prepared as input data. The input data are read (300) and checked for validity (302). Then the input data are arranged into an array of suitable data structure (304). For example, each rectangular region may have a link to a set of data or data objects containing necessary information. The number of (unknown) Fourier coefficients used in the solution to Laplace's equation is set (306). For example, only the lowest (zero-th) order coefficients, or both the zero-th and first order coefficients (and higher) may be used, depending on the required accuracy and/or available time for the calculation.

Then, the power for a rectangular region is calculated in terms of the unknown coefficients (308), and the constraints due to the current continuity in that rectangular region are calculated in terms the unknown coefficients (310). These processes are iteratively repeated until the power and the constraints are calculated for all of the rectangular regions (312).

The power of all rectangular regions are summed to obtain the total power (314), and the constraints due to the current continuity between the rectangular regions are calculated in terms the unknown coefficients (316). Then, the total power dissipation of the entire system (the conductor layer) is minimized in terms of the unknown coefficients (318). By minimizing the power dissipation, the value of the minimum power dissipation is obtained at the point where the coefficients yield the minimum power dissipation. The resistance of the conductor layer is obtained by dividing the minimum power dissipation by the square of the current entering the conductor layer (equation (6)) (320).

In addition, the method may also include a process whereby the accuracy of the calculation may be determined for a given geometric shape (322). Since the use of a greater number of unknown coefficients yields a more accurate calculation of the resistance value (though it takes more time), the calculation can be repeated with increasing numbers of unknown coefficients (324). The series of calculated resistance values will converge to the "true" value. For example, the first resistance value is calculated using only the zeroth order coefficients, the second resistance value is obtained (through steps 308 to 320) using the zeroth and first order coefficients, and so forth. A stopping test, such as the relative difference between resistance values, can be applied. The details of the stopping test are determined by the desired accuracy of the solution or by the time available for computation. Once the resistance value is calculated, it can be used in any circuit simulation of the IC design.

Figure 7:
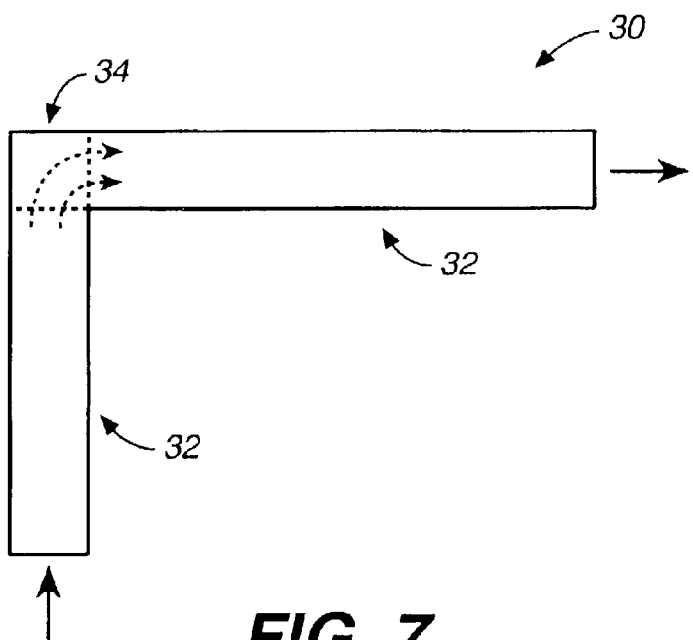
FIG. 7 is a diagram schematically illustrating a conductor layer of an elbow shape.

FIG. 7 schematically illustrates a conductor layer 30 of a simple elbow shape. The number of squares in each arm 32 is the length of the arm 32 divided by its width. At the joint portion 34, the current turns 90°. As mentioned above, the length of the current path and the effective width are hard to define in the joint portion 34. Suppose that the widths of the two arms 32 are identical so the joint portion 34 is a square. The effective number of electrical squares of the joint is known to be between 0.55 and 0.56. Using the lowest order (least accurate, but simplest) of Fourier coefficients in the above described method (using equation (9) with h=w), the resistance of 0.67 squares is obtained. If the first-order corrections are included, the number of squares of the joint 34 decreases to 0.60. However, these numbers are by way of example and are not intended to be exhaustive or limiting in any way.

In addition, the present invention is also applicable to three-dimensional conductor structures. The two dimensional formulas, as described above, may be extended to three-dimensional conductor structures such as a conductor layer having a certain thickness, a via formed between conductor layers, and the like. In accordance with one embodiment of the present invention, the conductor structure (conductor system) has a three-dimensional shape defined by boundary surfaces (external boundary faces). In this three-dimensional case, the conductor structure is partitioned into a plurality of three-dimensional blocks. Source and sink faces of the blocks are used instead of source and sink edges of rectangular regions. That is, at least one source face and at least one sink face are determined from among the boundary surfaces, where a current enters the conductor structure through the source face(s) and leaves the conductor structure through the sink face(s). Boundary conditions are set with respect to the current for each of the blocks, i.e., the boundary conditions are set at outer faces (external boundary faces) and/or inner faces (internal boundary faces between adjacent blocks) for each block. The power is calculated for each block with the boundary conditions (in terms of unknown coefficients), and then the total power of the conductor structure is calculated based on the power and the boundary conditions of each of the blocks (in terms of unknown coefficients). The resistance of the conductor structure is obtained by minimizing the power dissipation of the conductor structure.

Similarly to the two-dimensional example, the calculation of the power of each block may include calculating constraints based on current continuity within each of the blocks in terms of Fourier coefficients, and the calculation of the total power of the conductor structure may include summing the power of the blocks and calculating constraints based on current continuity between the blocks in terms of Fourier coefficients. Other processes such as minimizing the power dissipation are also conducted in a similar manner as that of the two-dimensional case.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A method for calculating resistance of a conductor layer for an integrated circuit design, the conductor layer having a geometric shape defined by boundary edges, said method comprising:
   partitioning the geometric shape into a plurality of rectangular regions;
   determining at least one source edge and at least one sink edge from among the boundary edges, a current entering the conductor layer through the source edge and leaving the conductor layer through the sink edge;
   setting boundary conditions with respect to the current for each of the rectangular regions;
   calculating power for each of the rectangular regions with the boundary conditions;
   calculating power for the conductor layer based on the power and the boundary conditions of each of the rectangular regions; and
   obtaining the resistance of the conductor layer by minimizing dissipation of the calculated power of the conductor layer.

2. The method in accordance with claim 1 wherein said setting includes:
   setting Neumann boundary conditions for the boundary edges other than the source and sink edges.

3. The method in accordance with claim 2 wherein said setting further includes:
   setting current continuity conditions for internal boundaries between the rectangular regions.

4. The method in accordance with claim 1 wherein said calculating power for each of the rectangular regions includes:
   using Laplace's equation.

5. The method in accordance with claim 1, further comprising:
   expressing an electric potential of each of the rectangular region as a Fourier series.

6. The method in accordance with claim 5 wherein said calculating the power of each of the rectangular regions includes:
   calculating constraints based on current continuity within each of the rectangular regions in terms of Fourier coefficients.

7. The method in accordance with claim 6 wherein said calculating the power of the conductor layer includes:
   summing the power of each of the rectangular regions to obtain a total power dissipation of the conductor layer; and
   calculating constraints based on the current continuity between the rectangular regions in terms of the Fourier coefficients.

8. The method in accordance with claim 7 wherein said obtaining includes:
   determining the Fourier coefficients so as to minimize the total power dissipation of the conductor layer; and
   dividing the minimized power by a square of the current entering the conductor layer to yield the resistance.

9. The method in accordance with claim 8 wherein said obtaining further includes:
   approximating the resistance by using at least one Fourier coefficient selected in the increasing order from the lowest order.

10. The method in accordance with claim 9, further comprising:
    determining accuracy of the approximated resistance value; and
    iteratively repeating the calculation of the resistance using an increased number of Fourier coefficients until achieving a desired accuracy of the approximated resistance value.

11. An apparatus for calculating resistance of a conductor layer for an integrated circuit design, the conductor layer having a geometric shape defined by boundary edges, said apparatus comprising:
    means for partitioning the geometric shape into a plurality of rectangular regions;
    means for determining a source edge and a sink edge from among the boundary edges, a current entering the conductor layer through the source edge and leaving the conductor layer through the sink edge;
    means for setting boundary conditions with respect to the current for each of the rectangular regions;
    means for calculating power for each of the rectangular regions with the boundary conditions;
    means for calculating power for the conductor layer based on the power and the boundary conditions of each of the rectangular regions; and means for obtaining the resistance of the conductor layer by minimizing dissipation of the calculated power of the conductor layer.

12. The apparatus in accordance with claim 11 wherein said means for setting includes:
means for setting Neumann boundary conditions for the boundary edges other than the source and sink edges.

13. The apparatus in accordance with claim 12 wherein said means for setting further includes:
means for setting current continuity conditions for internal boundaries between the rectangular regions.

14. The apparatus in accordance with claim 11 wherein said means for calculating power for each of the rectangular regions includes:
means for using Laplace's equation.

15. The apparatus in accordance with claim 11, further comprising:
means for expressing an electric potential of each of the rectangular region as a Fourier series.

16. The apparatus in accordance with claim 15 wherein said means for calculating the power of each of the rectangular regions includes:
means for calculating constraints based on current continuity within each of the rectangular regions in terms of Fourier coefficients.

17. The apparatus in accordance with claim 16 wherein said means for calculating the power of the conductor layer includes:
means for summing the power of each of the rectangular regions to obtain a total power dissipation of the conductor layer; and
means for calculating constraints based on the current continuity between the rectangular regions in terms of the Fourier coefficients.

18. The apparatus in accordance with claim 17 wherein said means for obtaining includes:
means for determining the Fourier coefficients so as to minimize the total power dissipation of the conductor layer; and
means for dividing the minimized power by a square of the current entering the conductor layer to yield the resistance.

19. The apparatus in accordance with claim 18 wherein said means for obtaining further includes:
means for approximating the resistance by using at least one Fourier coefficient selected in the increasing order from the lowest order.

20. The apparatus in accordance with claim 19, further comprising:
means for determining accuracy of the approximated resistance value; and
means for iteratively repeating the calculation of the resistance using an increased number of Fourier coefficients until achieving a desired accuracy of the approximated resistance value.

21. A program storage device readable by a machine, tangibly embodying a program of instructions executable by the machine to perform a method for calculating resistance of a conductor layer for an integrated circuit design, the conductor layer having a geometric shape defined by boundary edges, the method comprising:
partitioning the geometric shape into a plurality of rectangular regions;
determining a source edge and a sink edge from among the boundary edges, a current entering the conductor layer through the source edge and leaving the conductor layer through the sink edge;
setting boundary conditions with respect to the current for each of the rectangular regions;
calculating power for each of the rectangular regions with the boundary conditions;
calculating power for the conductor layer based on the power and the boundary conditions of each of the rectangular regions; and
obtaining the resistance of the conductor layer by minimizing dissipation of the calculated power of the conductor layer.

22. A method for calculating resistance of a conductor structure for an integrated circuit design, the conductor structure having a three-dimensional shape defined by boundary surfaces, said method comprising:
partitioning the conductor structure into a plurality of three-dimensional blocks;
determining at least one source face and at least one sink face from among the boundary surfaces, a current entering the conductor structure through the source face and leaving the conductor structure through the sink face;
setting boundary conditions with respect to the current for each of the blocks;
calculating power for each of the blocks with the boundary conditions;
calculating power for the conductor structure based on the power and the boundary conditions of each of the blocks; and
obtaining the resistance of the conductor layer by minimizing dissipation of the calculated power of the conductor layer.

23. The method in accordance with claim 22 wherein said setting includes:
setting Neumann boundary conditions for the boundary surfaces other than the source and sink faces.

24. The method in accordance with claim 23 wherein said setting further includes:
setting current continuity conditions for internal boundaries between the blocks.

25. The method in accordance with claim 22 wherein said calculating power for each of the blocks includes:
using Laplace's equation.

26. The method in accordance with claim 22, further comprising:
expressing an electric potential of each of the rectangular region as a Fourier series.

27. The method in accordance with claim 26 wherein said calculating the power of each of blocks includes:
calculating constraints based on current continuity within each of the blocks in terms of Fourier coefficients.

28. The method in accordance with claim 27 wherein said calculating the power of the conductor structure includes:
summing the power of each of the blocks to obtain a total power dissipation of the conductor structure; and
calculating constraints based on the current continuity between the blocks in terms of the Fourier coefficients.

29. The method in accordance with claim 28 wherein said obtaining includes:
determining the Fourier coefficients so as to minimize the total power dissipation of the conductor structure; and
dividing the minimized power by a square of the current entering the conductor structure to yield the resistance.

30. The method in accordance with claim 29 wherein said obtaining further includes:

approximating the resistance by using at least one Fourier coefficient selected in the increasing order from the lowest order.

31. The method in accordance with claim 30, further comprising:

determining accuracy of the approximated resistance value; and iteratively repeating the calculation of the resistance using an increased number of Fourier coefficients until achieving a desired accuracy of the approximated resistance value.

32. An apparatus for calculating resistance of a conductor structure for an integrated circuit design, the conductor structure having a three-dimensional shape defined by boundary surfaces, said apparatus comprising:

means for partitioning the conductor structure into a plurality of three-dimensional blocks;

means for determining a source face and a sink face from among the boundary surfaces, a current entering the conductor structure through the source face and leaving the conductor structure through the sink face;

means for setting boundary conditions with respect to the current for each of the blocks;

means for calculating power for each of the blocks with the boundary conditions;

means for calculating power for the conductor structure based on the power and the boundary conditions of each of the blocks; and means for obtaining the resistance of the conductor layer by minimizing dissipation of the calculated power of the conductor layer.

33. The apparatus in accordance with claim 32 wherein said means for setting includes:

means for setting Neumann boundary conditions for the boundary surfaces other than the source and sink faces.

34. The apparatus in accordance with claim 33 wherein said means for setting further includes:

means for setting current continuity conditions for internal boundaries between the blocks.

35. The apparatus in accordance with claim 32 wherein said means for calculating power for each of the blocks includes:

means for using Laplace's equation.

36. The apparatus in accordance with claim 32, further comprising:

means for expressing an electric potential of each of the rectangular region as a Fourier series.

37. The apparatus in accordance with claim 36 wherein said means for calculating the power of each of blocks includes:

means for calculating constraints based on current continuity within each of the blocks in terms of Fourier coefficients.

38. The apparatus in accordance with claim 37 wherein said means for calculating the power of the conductor structure includes:

means for summing the power of each of the blocks to obtain a total power dissipation of the conductor structure; and means for calculating constraints based on the current continuity between the blocks in terms of the Fourier coefficients.

39. The apparatus in accordance with claim 38 wherein said means for obtaining includes:

means for determining the Fourier coefficients so as to minimize the total power dissipation of the conductor structure; and means for dividing the minimized power by a square of the current entering the conductor structure to yield the resistance.

40. The apparatus in accordance with claim 39 wherein said means for obtaining further includes:

means for approximating the resistance by using at least one Fourier coefficient selected in the increasing order from the lowest order.

41. The apparatus in accordance with claim 40, further comprising:

means for determining accuracy of the approximated resistance value; and means for iteratively repeating the calculation of the resistance using an increased number of Fourier coefficients until achieving a desired accuracy of the approximated resistance value.

42. A program storage device readable by a machine, tangibly embodying a program of instructions executable by the machine to perform a method for calculating resistance of a conductor structure for an integrated circuit design, the conductor structure having a three-dimensional shape defined by boundary surfaces, the method comprising:

partitioning the conductor structure into a plurality of three-dimensional blocks;

determining a source face and a sink face from among the boundary surfaces, a current entering the conductor structure through the source face and leaving the conductor structure through the sink face;

setting boundary conditions with respect to the current for each of the blocks;

calculating power for each of the blocks with the boundary conditions;

calculating power for the conductor structure based on the power and the boundary conditions of each of the blocks; and obtaining the resistance of the conductor layer by minimizing dissipation of the calculated power of the conductor layer.

* * * * *